(12) United States Patent
Chen et al.

(10) Patent No.: US 11,088,400 B2
(45) Date of Patent: Aug. 10, 2021

(54) BATTERY MANAGEMENT SYSTEM

(71) Applicant: CYBER POWER SYSTEMS, INC., Taipei (TW)

(72) Inventors: Ta-Peng Chen, Taipei (TW); Hung-Ming Hsieh, Taipei (TW)

(73) Assignee: CYBER POWER SYSTEMS, INC., Taipei (TW)

( * ) Notice: Subject to any disclaimer, the term of this patent is extended or adjusted under 35 U.S.C. 154(b) by 103 days.

(21) Appl. No.: 16/274,721

(22) Filed: Feb. 13, 2019

(65) Prior Publication Data
US 2020/0168956 A1 May 28, 2020

(30) Foreign Application Priority Data

Nov. 23, 2018 (CN) .......................... 201811407822.6

(51) Int. Cl.
| | |
|---|---|
| *H01M 10/48* | (2006.01) |
| *H01M 10/42* | (2006.01) |
| *G01R 31/3835* | (2019.01) |
| *G01R 31/367* | (2019.01) |
| *G01R 31/396* | (2019.01) |
| *H01M 50/569* | (2021.01) |

(52) U.S. Cl.
CPC ........ *H01M 10/425* (2013.01); *G01R 31/367* (2019.01); *G01R 31/3835* (2019.01); *G01R 31/396* (2019.01); *H01M 10/482* (2013.01); *H01M 50/569* (2021.01); *H01M 10/48* (2013.01); *H01M 2010/4271* (2013.01); *H01M 2010/4278* (2013.01)

(58) Field of Classification Search
None
See application file for complete search history.

(56) References Cited

U.S. PATENT DOCUMENTS

| | | | | |
|---|---|---|---|---|
| 2006/0193095 | A1* | 8/2006 | Hunter .................. | H02J 7/0019 361/64 |
| 2010/0176931 | A1* | 7/2010 | Bennett ............... | H04L 61/2038 340/10.4 |
| 2013/0134778 | A1* | 5/2013 | Tamanaha ................. | H02J 7/04 307/10.1 |

(Continued)

FOREIGN PATENT DOCUMENTS

CN        1689208 A        10/2005

*Primary Examiner* — Jeremiah R Smith
(74) *Attorney, Agent, or Firm* — Bacon & Thomas, PLLC

(57) ABSTRACT

A battery management system comprises a battery manager and battery sensors for sensing related information of each battery in a battery string. The batteries in the battery string are divided into a plurality of first groups. The battery sensors are divided into a plurality of second groups. Each second group senses the batteries in a corresponding first group, and each battery sensor senses at least one battery. Each of a part of the communication ports of the battery manager is signally connected to the battery sensors of one of the second groups. The number of the battery sensors in each second group is less than or equal to the number of battery sensors that each communication port can support. The battery manager merges the battery sensors signally connected to the part of the communication ports into one group according to a merging command, and regards the merged battery sensors as battery sensors of a same battery string accordingly.

12 Claims, 10 Drawing Sheets

(56) References Cited

U.S. PATENT DOCUMENTS

| | | | |
|---|---|---|---|
| 2016/0172901 A1* | 6/2016 | Hsieh | H02J 9/061 307/66 |
| 2017/0336479 A1* | 11/2017 | Busser | G01R 31/3648 |
| 2019/0011972 A1* | 1/2019 | Chen | G01R 31/3646 |
| 2021/0091583 A1* | 3/2021 | Kamijima | G06N 20/00 |

* cited by examiner

BATTERY MANAGEMENT SYSTEM

BACKGROUND OF THE INVENTION

Field of the Invention

The present invention relates to the technical field of battery management, and in particular, to a battery management system.

Description of Related Art

Generally, a battery management system comprises a battery manager and a plurality of battery sensors. The battery sensors are used to sense related information of each battery of a plurality of battery strings and transmit the related information to the battery manager, so that the battery manager can manage the batteries. For example, the battery manager can performs voltage balancing operations on the batteries in each battery string based on the received information.

Each communication port of the battery manager is signally connected to the battery sensors corresponding to a battery string, and the number of the battery sensors signally connected to each communication port matches the number of the batteries of a corresponding battery string. However, the number of the battery sensors signally connected to each communication port of the battery manager is limited by the communication power consumption and distance. For example, the number of the battery sensors signally connected to each communication port of the battery manager is limited to 50. From the above, it can be seen that since the number of battery sensors that each communication port can support is limited (e.g., limited to 50), the battery management system cannot support a battery string having a number of batteries exceeding 50 (e.g., 100).

SUMMARY OF THE INVENTION

An object of the present invention is to provide a battery management system which solves the aforementioned issues.

To achieve the above object, the present invention provides a battery management system, which comprises a plurality of battery sensors and a battery manager. The battery sensors are used for sensing related information of each battery in a battery string. The batteries in the battery string are divided into a plurality of first groups, and each first group comprises a plurality of batteries connected in series. The battery sensors are divided into a plurality of second groups, each second group is configured to sense the batteries in a corresponding first group, and each battery sensor is configured to sense at least one battery. The battery manager comprises a plurality of communication ports, each of a part of the communication ports is signally connected to the battery sensors of one of the second groups. The number of the battery sensors of each second group is less than or equal to the number of battery sensors that each communication port can support. The battery manager is configured to merge the battery sensors signally connected to the part of the communication ports into one group according to a merging command, and regard the merged battery sensors as battery sensors of a same battery string accordingly.

In order to make the above objects, technical features and gains after actual implementation more obvious and easy to understand, in the following, the preferred embodiments will be described with reference to the corresponding drawings and will be described in more detail.

BRIEF DESCRIPTION OF THE DRAWINGS

Other features and advantages of the present invention will become apparent in the following detailed description of the preferred embodiments with reference to the accompanying drawings, of which:

FIG. 1-2 shows a battery management system according to an embodiment of the present invention and shows its second state.

FIG. 2 illustrates one of the ways to provide a merging command.

DESCRIPTION OF EMBODIMENTS

The characteristics, contents, advantages and achieved effects of the present disclosure will become more fully understood from the detailed description given herein below and the accompanying drawings which are given by way of illustration only, and thus are not limitative of the present disclosure.

As required, detailed embodiments are disclosed herein. It must be understood that the disclosed embodiments are merely exemplary of and may be embodied in various and alternative forms, and combinations thereof. As used herein, the word "exemplary" is used expansively to refer to embodiments that serve as illustrations, specimens, models, or patterns. The figures are not necessarily to scale and some features may be exaggerated or minimized to show details of particular components. In other instances, well-known components, systems, materials, or methods that are known to those having ordinary skill in the art have not been described in detail in order to avoid obscuring the present disclosure. Therefore, specific structural and dimensional details disclosed herein are not to be interpreted as limiting, but merely as a basis for the claims and as a representative basis for teaching one skilled in the art.

Figure 1:
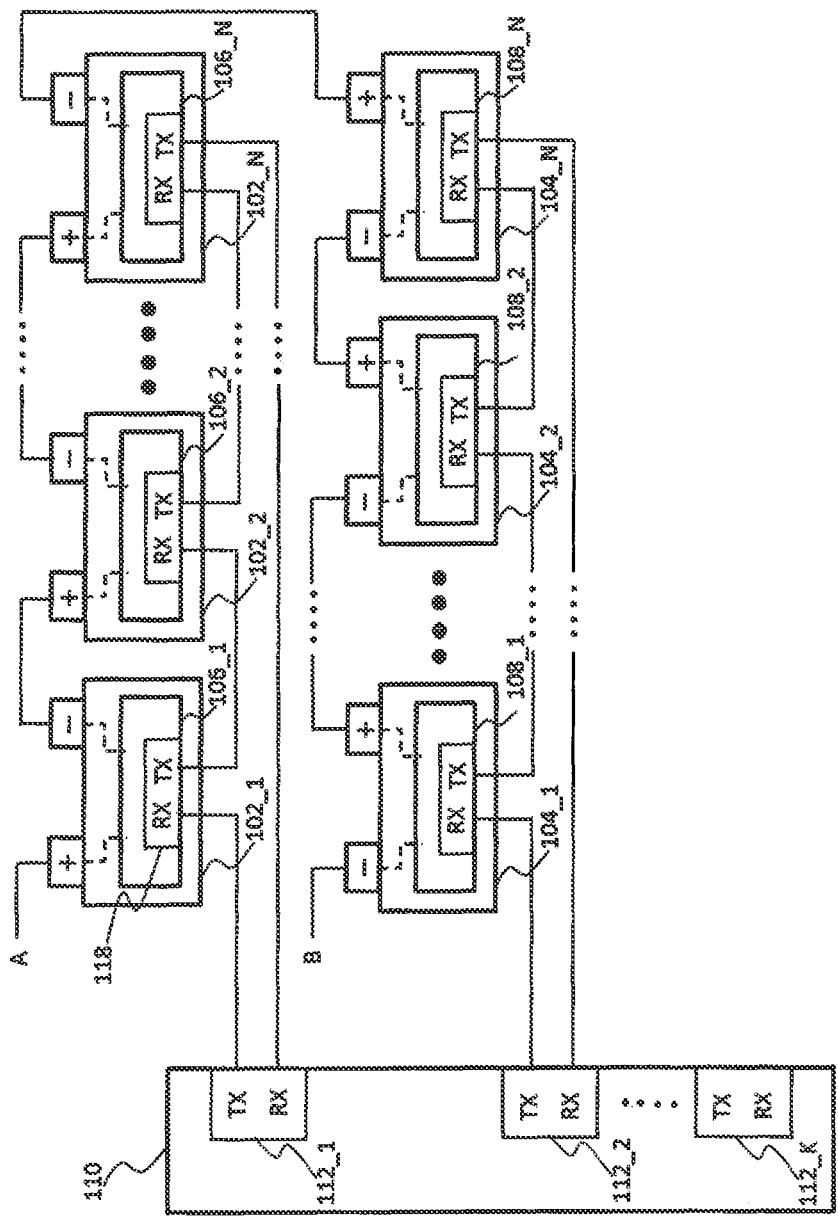
FIG. 1-1 shows a battery management system according to an embodiment of the present invention and shows its first state.

For convenience of description, the following embodiments are exemplified by a single battery string. However, this is not intended to limit the present invention. FIG. 1-1 shows a battery management system according to an embodiment of the present invention and shows its first state. As shown in FIG. 1-1, the battery management system comprises a battery manager 110, battery sensors 106_1-106_N, and battery sensors 108_1-108_N, where N is a positive integer. In addition, each battery sensor comprises a communication port (as indicated by reference numeral 118). The battery sensors are used to sense related information of each battery of a battery string. The battery string comprises batteries 102_1-102_N and 104_1-104_N.

The batteries in the battery string are divided into a plurality of first groups. In this example, the batteries in the battery string are divided into two first groups, one of the first groups is composed of the batteries 102_1-102_N, and the other first group is composed of the batteries 104_1-104_N. As can be seen from FIG. 1-1, each first group comprises a plurality of batteries connected in series. In addition, the battery sensors are divided into a plurality of second groups. In this example, the battery sensors are divided into two second groups, one of the second groups is composed of the battery sensors 106_1-106_N, and the other second group is composed of the battery sensors 108_1-108_N. The battery sensors in each second group are used to sense the batteries in a corresponding first group, and each battery sensor is used to sense at least one battery. In this example, each battery sensor is used to sense a battery.

The battery manager 110 comprises communication ports 112_1-112_K, where K is a positive integer. Further, TX denotes a transmitting terminal, and RX denotes a receiving terminal. Each of a part of the communication ports is signally connected to the battery sensors of one of the second groups. In this example, the communication port 112_1 is signally connected to the battery sensors of one of the second groups, and the communication port 112_2 is signally connected to the battery sensors of the other second group. As shown in FIG. 1-1, the battery sensors of each second group are signally connected with each other in series. In addition, the number of the battery sensors of each second group is less than or equal to the number of battery sensors that each communication port can support.

With continued reference to FIG. 1-1, in a first state of the battery management system, the battery manager 110 regards the two first groups as two different battery strings, so the battery sensors of the two second groups are used to sense two different battery strings. At this time, the battery manager 110 determines whether a merging command of communication ports is received or not. If so, the battery manager 110 combines the battery sensors signally connected to the part of the communication ports (i.e., the communication ports 112_1 and 112_2) into one group according to the received merging command, and regards the merged battery sensors as battery sensors of a same battery string accordingly. The merging result is shown in FIG. 1-2.

Figures 1, 2:
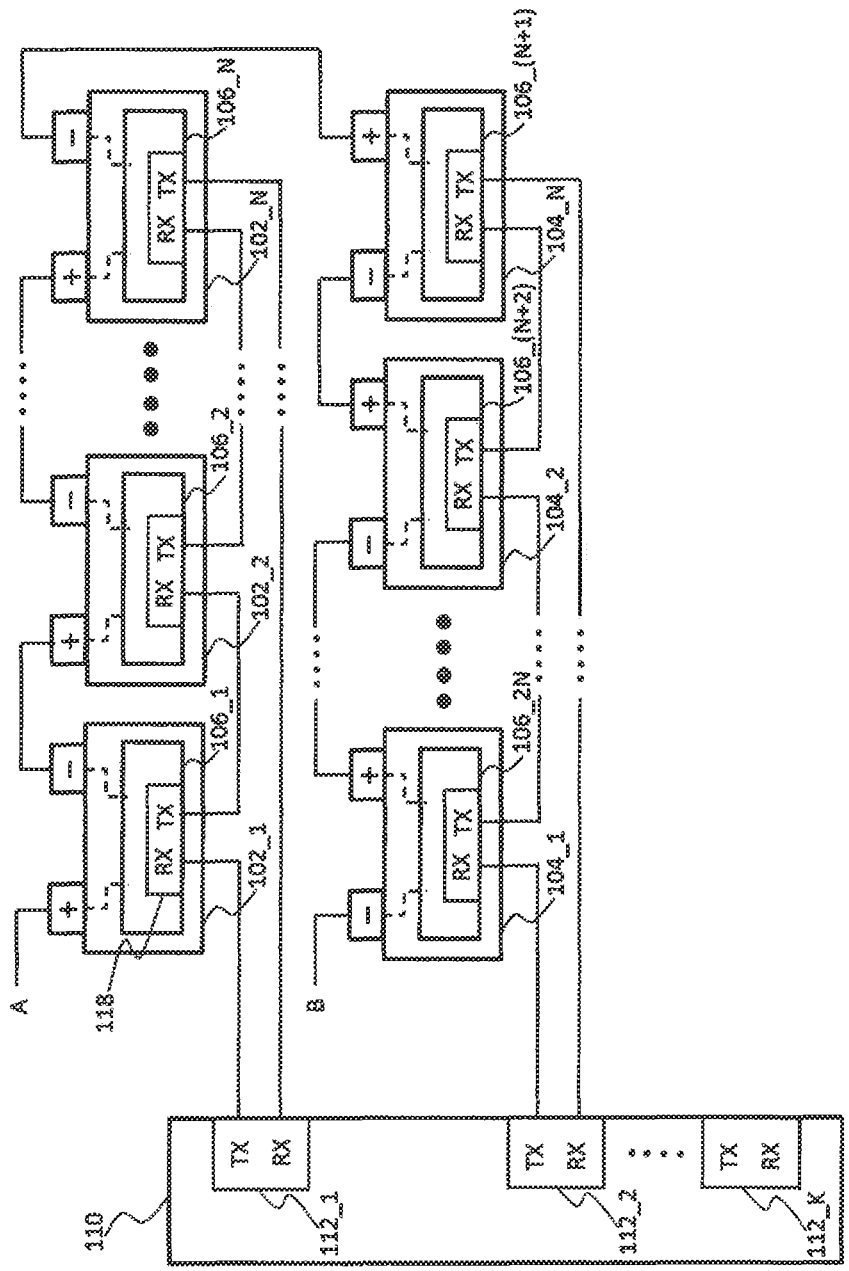
Figure 2:
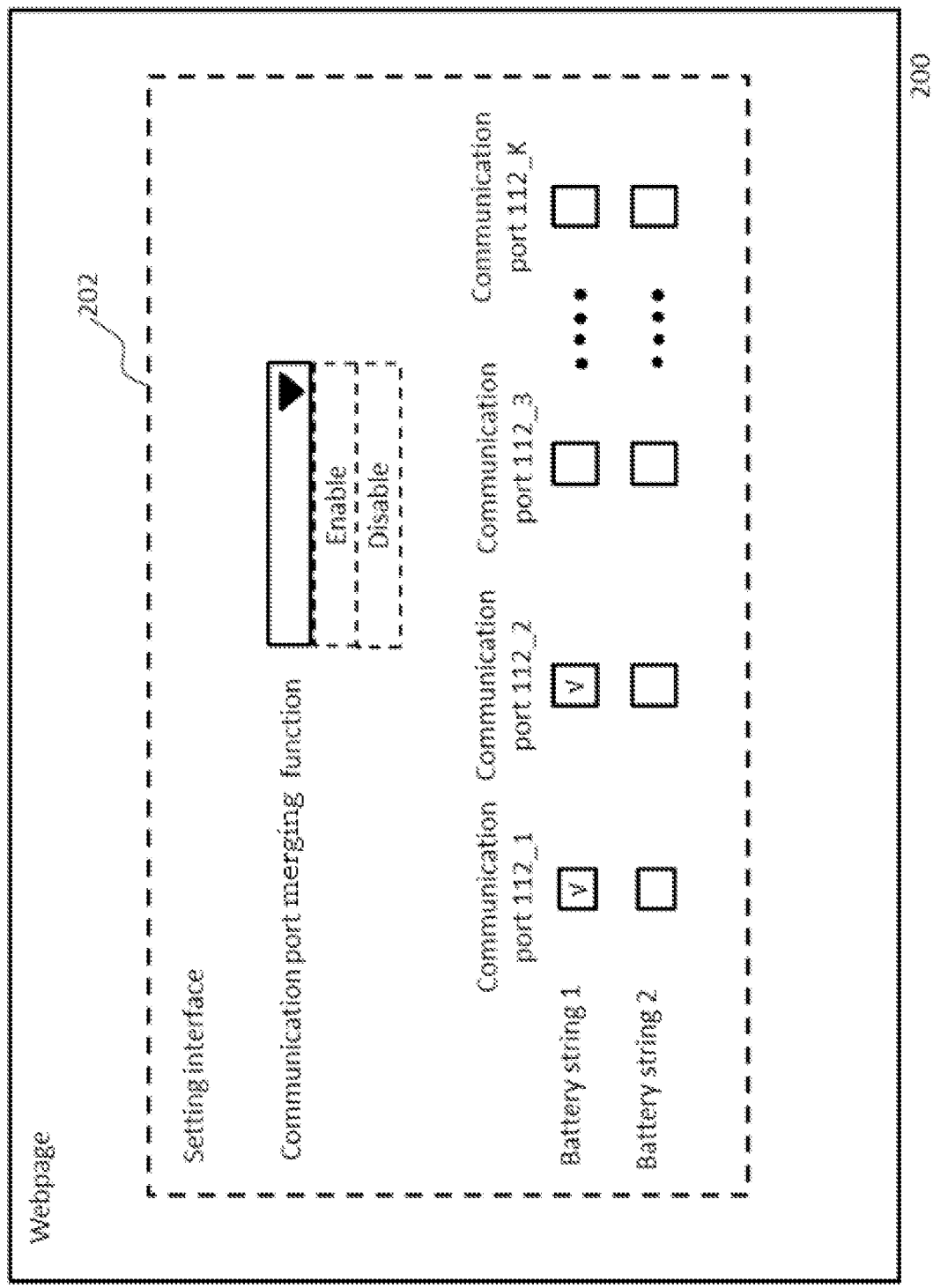

FIG. 1-2 shows a battery management system according to an embodiment of the present invention and shows its second state. As shown in FIG. 1-2, after the merging operation, the serial numbers of the battery sensors corresponding to the batteries 104_N-104_1 have been changed to 106_(N+1)-106_2N, so as to be merged with the battery sensors 106_1-106_N as battery sensors of the same battery string.

FIG. 2 illustrates one of the ways to provide a merging command. As shown in FIG. 2, the webpage 200 is provided by the battery manager 110 executing a web server program, and the webpage 200 is used to display a setting interface 202. Thus, a user can browse the webpage 200 through a desktop computer or a handheld electronic device (e.g., a notebook computer or a mobile phone) executing a browser program, and input a merging command through the setting interface 202. In the example shown in FIGS. 1-1 and 1-2, after the user enables the communication port merging function through the setting interface 202, the user can select the communication ports 112_1 and 112_2 to merge the battery sensors signally connected to these two communication ports as battery sensors of a same battery string (i.e., battery string 1).

Although in the above examples the merged communication ports are adjacent to each other, this is not intended to limit the present invention. It should be understood by those skilled in the art that at least two communication ports in the merged communication ports may not be adjacent to each other. Referring to FIG. 2 again, assume that the communication port 112_2 is damaged, the user can check the communication ports 112_1 and 112_3 to merge the battery sensors signally connected to these two communication ports as battery sensors of a same battery string (i.e., battery string 1).

Figure 3:
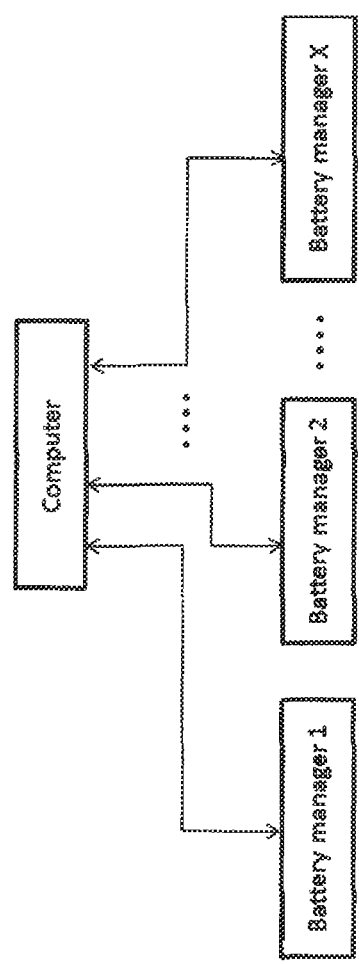
FIG. 3 shows a portion of a battery management system according to another embodiment of the present invention.

FIG. 3 shows a portion of a battery management system according to another embodiment of the present invention. Referring to FIG. 3, in this embodiment, the battery management system comprises a plurality of battery sensors (not shown), X battery managers, and a computer. The computer is configured to execute a web server program to provide the webpage 200, so as to display the setting interface 202 by the webpage 200. Thus, a user can browse the webpage 200 through a desktop computer or a handheld electronic device (e.g., a notebook computer or a mobile phone) executing a browser program, and input a merging command through the setting interface 202 to enable the battery managers to execute the merging command at the same time. Alternatively, the user can input different merging commands for different battery managers. In addition, in another embodiment, each battery manager in FIG. 3 can also execute a web server program to provide the webpage 200, so as to display the setting interface 202 by the webpage 200.

Figure 4:
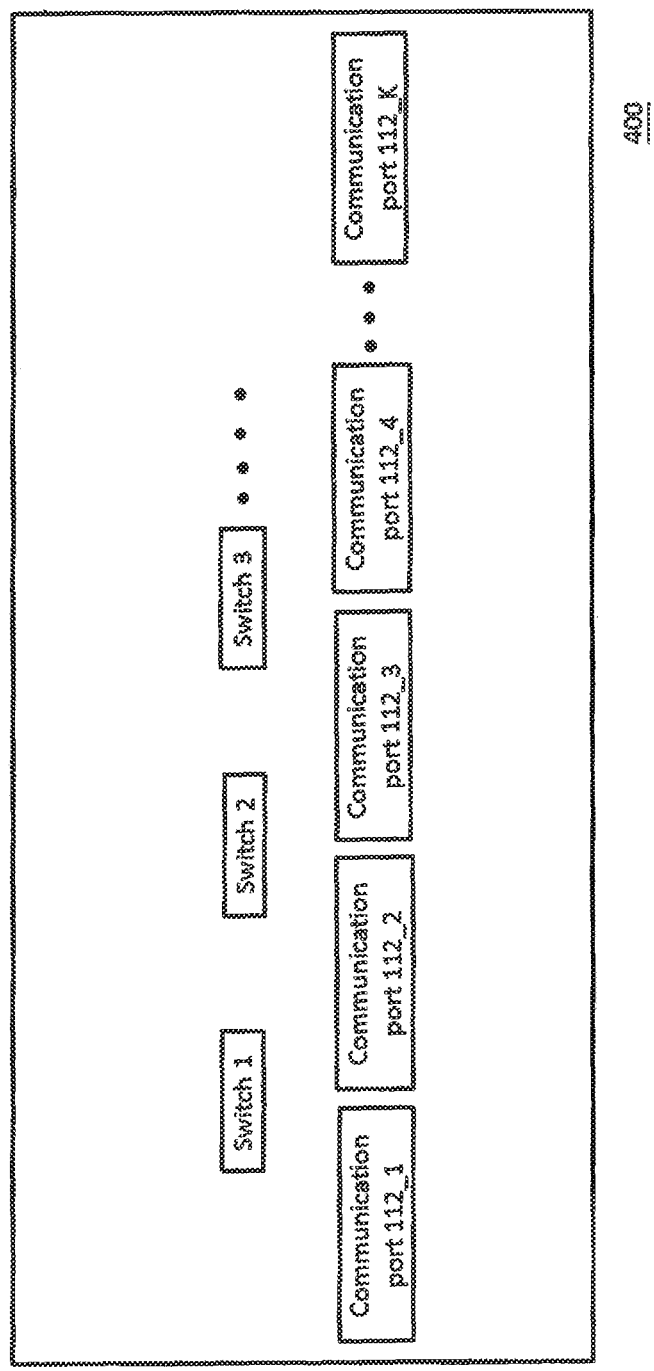
FIG. 4 illustrates another one of the ways to provide a merging command.

FIG. 4 illustrates another one of the ways to provide a merging command. Referring to FIG. 4, in this example, the battery manager 400 comprises a setting device for providing a merging command. The setting device comprises at least one switch. As shown in FIG. 4, the setting device comprises a plurality of switches. When a user switches the switch 1 from a first state (e.g., off state) to a second state (e.g., on state), a merging command can be provided to enable the battery manager 400 to perform a merging operation on the communication ports 112_1 and 112_2. Similarly, when the user switches the switch 3 from the first state (e.g., off state) to the second state (e.g., on state), a merging command can be provided to enable the battery manager 400 to perform a merging operation on the communication ports 112_3 and 112_4. Certainly, when the user switches the switches 1-3 from the first state (e.g., off state) to the second state (e.g., on state), a merging command can be provided to enable the battery manager 400 to perform a merging operation on the communication ports 112_1-112_4. In addition, assume that the communication port 112_2 is damaged and the user switches the switches 1-2 from the first state (e.g., off state) to the second state (e.g., on state), the battery manager 400 performs a merging operation on the communication ports 112_1 and 112_3 only. The above operations are only examples and are not intended to limit the present invention.

Figure 5:
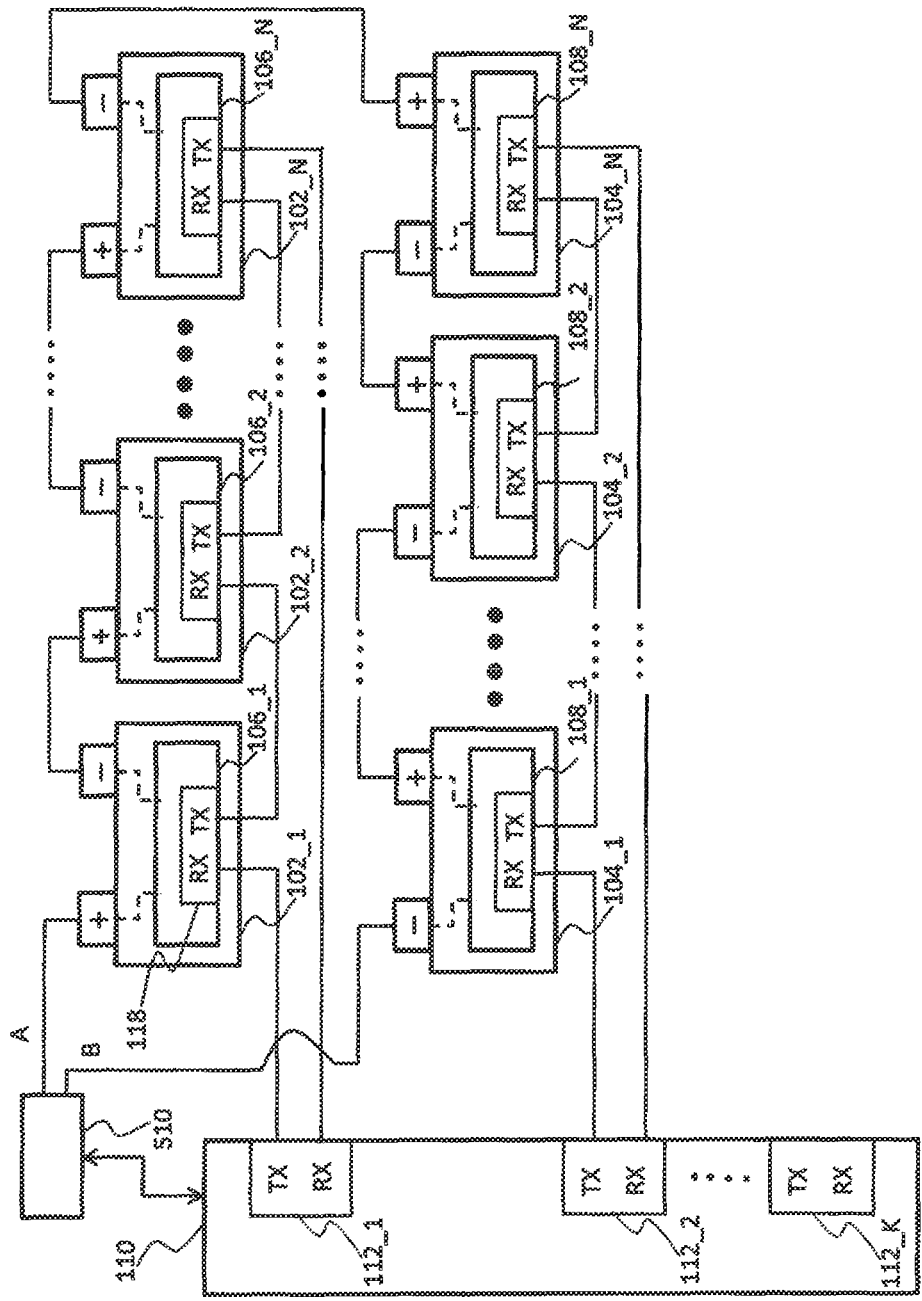
FIG. 5 shows a battery management system according to yet another embodiment of the present invention and illustrates yet another one of the ways to provide a merging command.

FIG. 5 shows a battery management system according to yet another embodiment of the present invention and illustrates yet another one of the ways to provide a merging command. As shown in FIG. 5, the battery management system comprises a battery manager 110, battery sensors 106_1-106_N, battery sensors 108_1-108_N, and a voltage sensor 510. The voltage sensor 510 is signally connected to the battery manager 110. In addition, the voltage sensor 510 is further electrically coupled to the terminals A and B of the battery string, so as to measure a total voltage of the battery string and transmit a measurement result to the battery manager 110, thereby enabling the battery manager 110 to determine whether to automatically generate a merging command according to the received measurement result. For example, when the measurement result indicates that the number of batteries corresponding to the total voltage is 100, the battery manager 110 determines that the number of batteries exceeds the number of battery sensors that each communication port can support (e.g., 50), and the battery manager 110 automatically generates a merging command to perform a merging operation on the communication ports 112_1 and 112_2.

With continued reference to FIG. 5, in another embodiment, the battery manager 110 is further configured to execute a web server program to provide the webpage 200, so as to display the setting interface 202 by the webpage 200. Thus, when the battery manager 110 receives the measurement result provided by the voltage sensor 510, the battery manager 110 determines whether to provide a message according to the received measurement result. For example, the battery manager 110 can display a message by the webpage 200, thereby suggesting the user to operate the settings interface 202 to generate a merging command.

Figure 6:
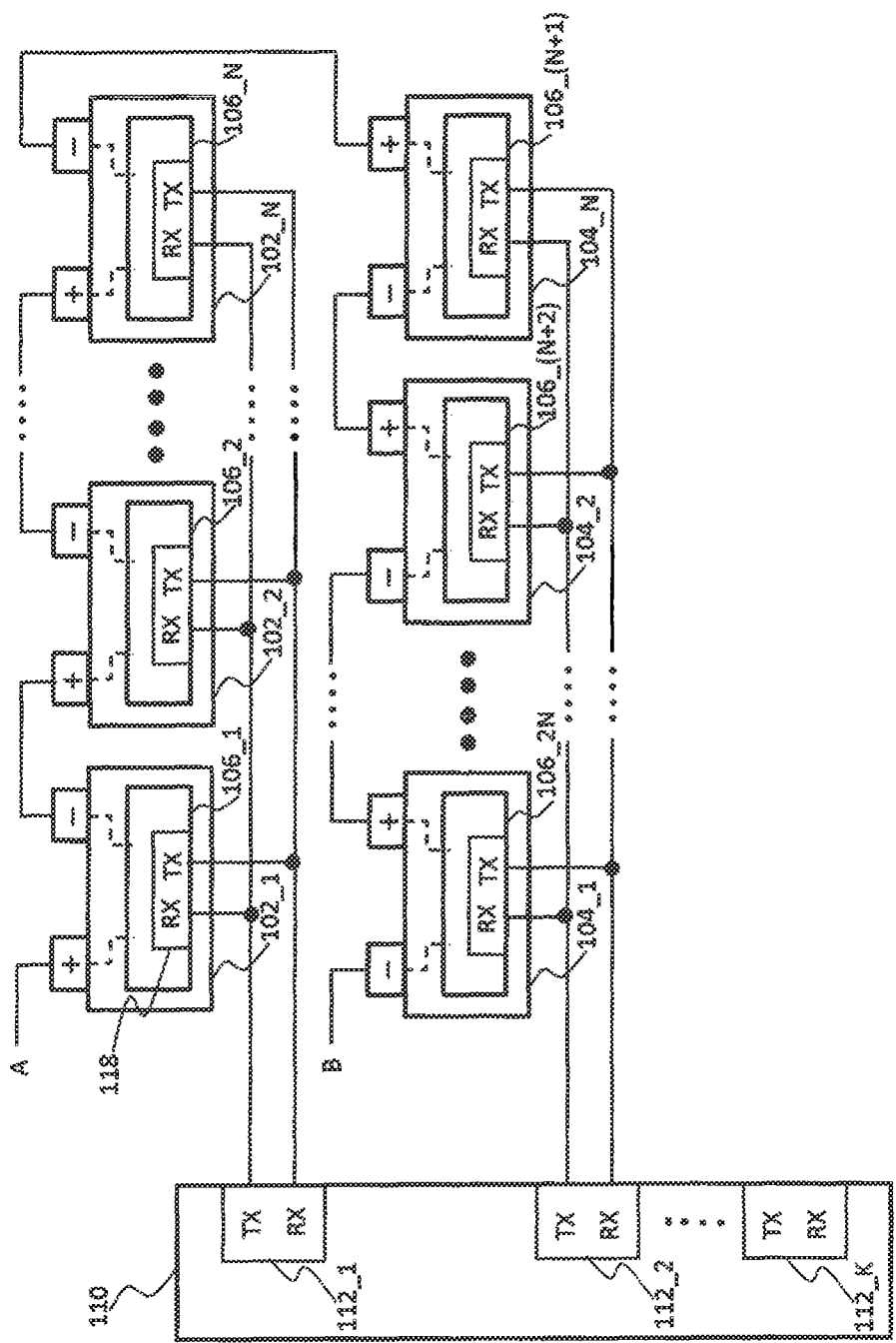
FIG. 6 shows a battery management system according to yet another embodiment of the present invention.

FIG. 6 shows a battery management system according to yet another embodiment of the present invention. As shown in FIG. 6, the battery management system has performed a merging operation on the communication ports 112_1 and 112_2. Compared with the battery management system shown in FIG. 1-2, the battery management system shown in FIG. 6 is different in that its battery sensors of each second group are signally connected with each other in parallel.

Figure 7:
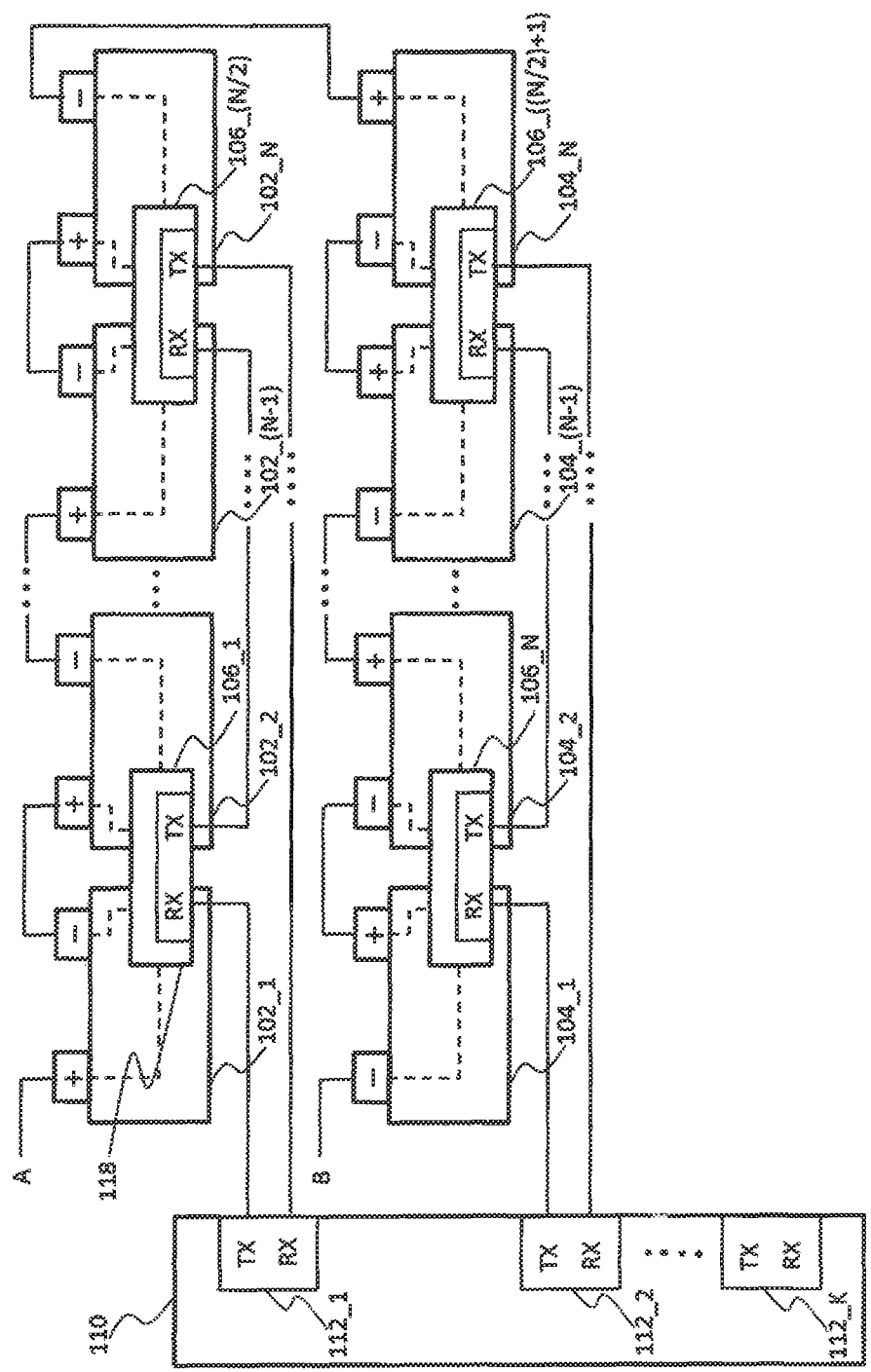
FIG. 7 shows a battery management system according to yet another embodiment of the present invention.

FIG. 7 shows a battery management system according to yet another embodiment of the present invention. As shown in FIG. 7, the battery management system has performed a merging operation on the communication ports 112_1 and 112_2. Compared with the battery management system shown in FIG. 1-2, the battery management system shown in FIG. 7 is different in that each of its battery sensors is used to sense two batteries. With this configuration, the number of battery sensors required can be reduced.

Figure 8:
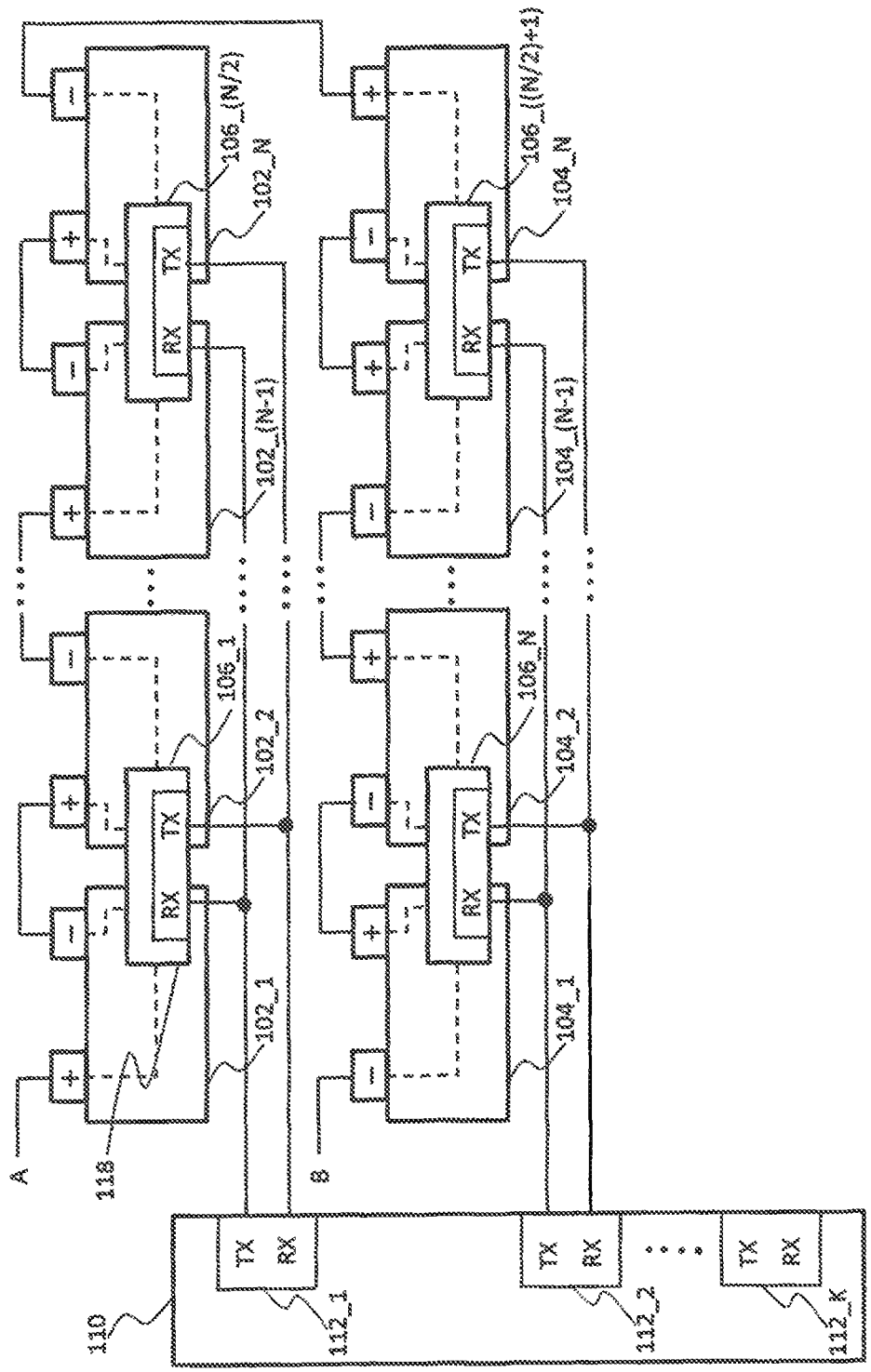
FIG. 8 shows a battery management system according to yet another embodiment of the present invention.

FIG. 8 shows a battery management system according to yet another embodiment of the present invention. As shown in FIG. 8, the battery management system has performed a merging operation on the communication ports 112_1 and 112_2. Compared with the battery management system shown in FIG. 6, the battery management system shown in FIG. 8 is different in that each of its battery sensors is used to sense two batteries.

Although in FIG. 7 and FIG. 8 each battery sensor is used to sense two batteries, this is not intended to limit the present invention. Those skilled in the art should know that each battery sensor can be used to sense more than three batteries.

Figure 9:
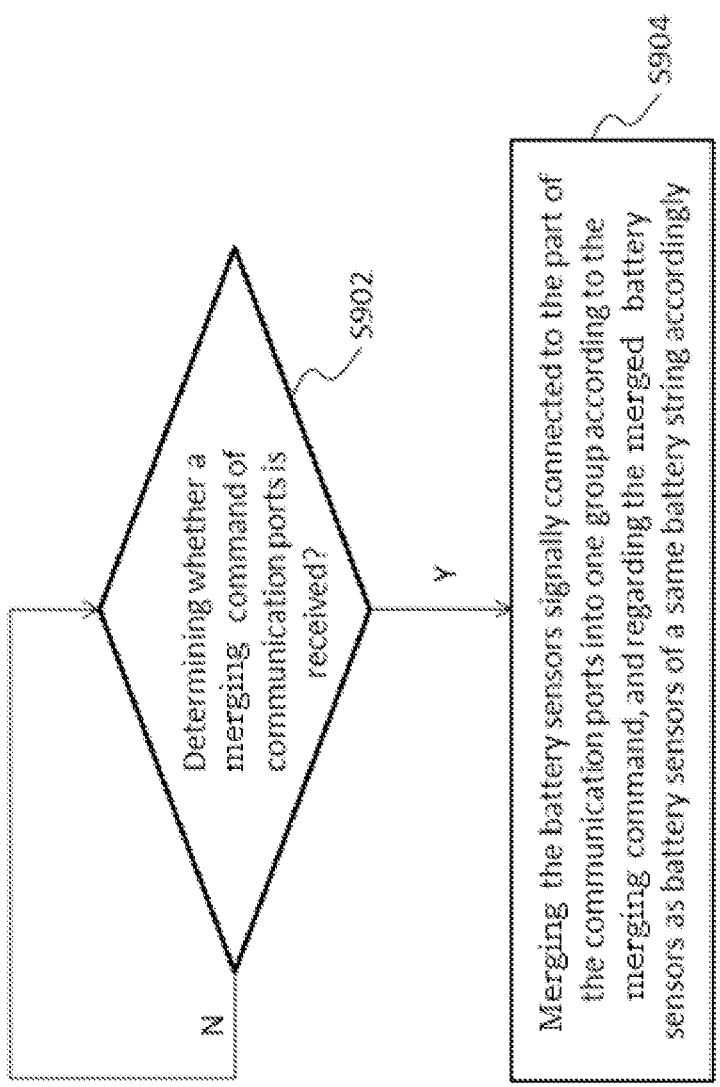
FIG. 9 shows a main operational flow of a battery manager according to an embodiment of the present invention.

From the description of the above embodiments, a main operational flow of the battery manager of the battery management system of the present invention can be summarized, as shown in FIG. 9. FIG. 9 shows a main operational flow of a battery manager according to an embodiment of the present invention. First, the battery manager determines whether a merging command of communication ports is received at any time (as shown in step S902). When the determination is NO, the battery manager returns to step S902. On the other hand, when the determination is YES, the battery manager merges the battery sensors signally connected to the part of the communication ports into one group according to the merging command, and regards the merged battery sensors as battery sensors of a same battery string accordingly (as shown in step S904).

In summary, since the battery manager of the battery management system of the present invention can merge the battery sensors signally connected to the part of the communication ports as battery sensors of a same battery string according to a merging command, such battery management system can support a battery string having a number of batteries exceeding the number of battery sensors that each communication port can support.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A battery management system, comprising:
a plurality of battery sensors for sensing related information of each battery in a battery string, wherein the batteries in the battery string are divided into a plurality of first groups, each first group comprises a plurality of batteries connected in series, the battery sensors are divided into a plurality of second groups, each second group is configured to sense the batteries in a corresponding first group, each battery sensor is configured to sense at least one battery, and the battery sensors in each second group are numbered with serial numbers; and
a battery manager having a plurality of communication ports, each of a part of the communication ports being signally connected to the battery sensors of one of the second groups, wherein the number of the battery sensors of each second group is less than or equal to the number of battery sensors that each communication port can support, and the battery manager is configured to change the serial numbers of the battery sensors of at least one second group to merge the battery sensors signally connected to the part of the communication ports as the battery sensors in a same battery string according to a merging command.

2. The battery management system as claimed in claim 1, wherein the battery manager is configured to execute a first web server program to provide a first webpage, so as to display a setting interface by the first webpage, thereby allowing a user to input the merging command through the setting interface.

3. The battery management system as claimed in claim 2, further comprising a computer, wherein the computer is signally connected to the battery manager, and the computer is configured to execute a second web server program to provide a second webpage, so as to display the setting interface by the second webpage, thereby allowing the user to input the merging command through the setting interface.

4. The battery management system as claimed in claim 3, wherein the setting device comprises at least one switch.

5. The battery management system as claimed in claim 1, wherein the battery manager further comprises a setting device for providing the merging command.

6. The battery management system as claimed in claim 1, further comprising a voltage sensor signally connected to the battery manager, wherein the voltage sensor is configured to measure a total voltage of the battery string and to transmit a measurement result to the battery manager, so that the battery manager determines whether to automatically generate the merging command according to the received measurement result.

7. The battery management system as claimed in claim 1, further comprising a voltage sensor signally connected to the battery manager, wherein the voltage sensor is configured to measure a total voltage of the battery string and to transmit a measurement result to the battery manager, and the battery manager is further configured to execute a first web server program to provide a first webpage, so as to display a setting interface by the first webpage, and the battery manager determines whether to suggest a user to operate the setting interface to generate the merging command according to the received measurement result.

8. The battery management system as claimed in claim 7, further comprising a computer signally connected to the battery manager, wherein the computer is configured to execute a second web server program to provide a second webpage, so as to display the setting interface by the second webpage, thereby allowing the user to input the merging command through the setting interface.

9. The battery management system as claimed in claim 1, wherein the communication ports of the part are adjacent to each other.

10. The battery management system as claimed in claim 1, wherein at least two communication ports of the part are not adjacent to each other.

11. The battery management system as claimed in claim 1, wherein the battery sensors of each second group are signally connected with each other in series.

12. The battery management system as claimed in claim 1, wherein the battery sensors of each second group are signally connected with each other in parallel.

* * * * *